(12) United States Patent
Phillips et al.

(10) Patent No.: US 6,989,922 B2
(45) Date of Patent: Jan. 24, 2006

(54) DEFORMABLE MIRROR ACTUATION SYSTEM

(75) Inventors: Alton Phillips, Mountain View, CA (US); Michael Sogard, Menlo Park, CA (US)

(73) Assignee: Nikon Corporation, Tokyo (JP)

( * ) Notice: Subject to any disclaimer, the term of this patent is extended or adjusted under 35 U.S.C. 154(b) by 99 days.

(21) Appl. No.: 10/373,687

(22) Filed: Feb. 27, 2003

(65) Prior Publication Data

US 2003/0234970 A1 Dec. 25, 2003

Related U.S. Application Data

(60) Provisional application No. 60/390,158, filed on Jun. 21, 2002.

(51) Int. Cl.
*G02B 26/08* (2006.01)
*G02B 26/00* (2006.01)
*G02B 27/00* (2006.01)

(52) U.S. Cl. .................... 359/291; 359/290; 359/224; 359/223; 359/578

(58) Field of Classification Search ................ 359/290, 359/291, 224, 223, 578, 579, 846, 847, 849, 359/238
See application file for complete search history.

(56) References Cited

U.S. PATENT DOCUMENTS

| | | | |
|---|---|---|---|
| 4,655,563 A | 4/1987 | Plante et al. ............... 359/849 |
| 4,950,878 A | 8/1990 | Ulich et al. ............. 250/201.9 |
| 4,967,063 A | 10/1990 | Wang et al. ............. 250/201.1 |
| 5,210,653 A | * 5/1993 | Schell ........................ 359/846 |
| 5,420,436 A | 5/1995 | Seya et al. ............... 250/492.1 |
| 5,684,566 A | 11/1997 | Stanton ....................... 60/327 |
| 5,745,309 A | 4/1998 | Salmon ..................... 359/846 |
| 5,815,310 A | 9/1998 | Williamson .................. 359/365 |
| 5,912,731 A | 6/1999 | DeLong et al. ............. 356/121 |
| 2001/0040743 A1 | * 11/2001 | Graves et al. |

OTHER PUBLICATIONS

Ealey: "Actuators: Design Fundamentals, Key Performance Specifications, and Parametric Trades"; SPIE vol. 1543 Active and Adaptive Optical Components, 1991; pp. 346–362.

Ealey et al.; "Deformable Mirrors: Design Fundamentals, Key Performance Specifications, and Parametric Trades"; SPIE vol. 1543 Active and Adaptive Optical Components, 1991; pp. 36–51.

Ealey: "Active and Adaptive Optical Components; The Technology and Future Trends"; SPIE vol. 1543 Active and Adaptive Optical Components, 1991; pp. 2–34.

* cited by examiner

*Primary Examiner*—Timothy Thompson
(74) *Attorney, Agent, or Firm*—Whitham, Curtis & Christofferson, P.C.

(57) ABSTRACT

Mechanical control and actuation of an adaptive optical element provides highly stable and repeatable correction of the shape of an optical element to an accuracy of a small fraction of a very short wavelength of light, responsive to a metrology source and sensor arrangement. Actuators in the form of individual set-screws or other actuators capable of axially positioning a shaft are driven by a robotic screw driver with four degrees of freedom or one or more linear actuators to exert force on the mirror. Positive or negative force may be used for outward and/or inward deflection of the mirror. When a desired force is developed on the mirror through a mechanical linkage, the linkage may be clamped by a passive clamp which may be released by an actuator such that the adjustment is maintained while the linear actuator and the clamp actuator are turned off; yielding a highly stable adjustment while effectively removing sources of actuator drift, noise, vibration and heating which may adversely affect stability.

26 Claims, 9 Drawing Sheets

Top View          Side View

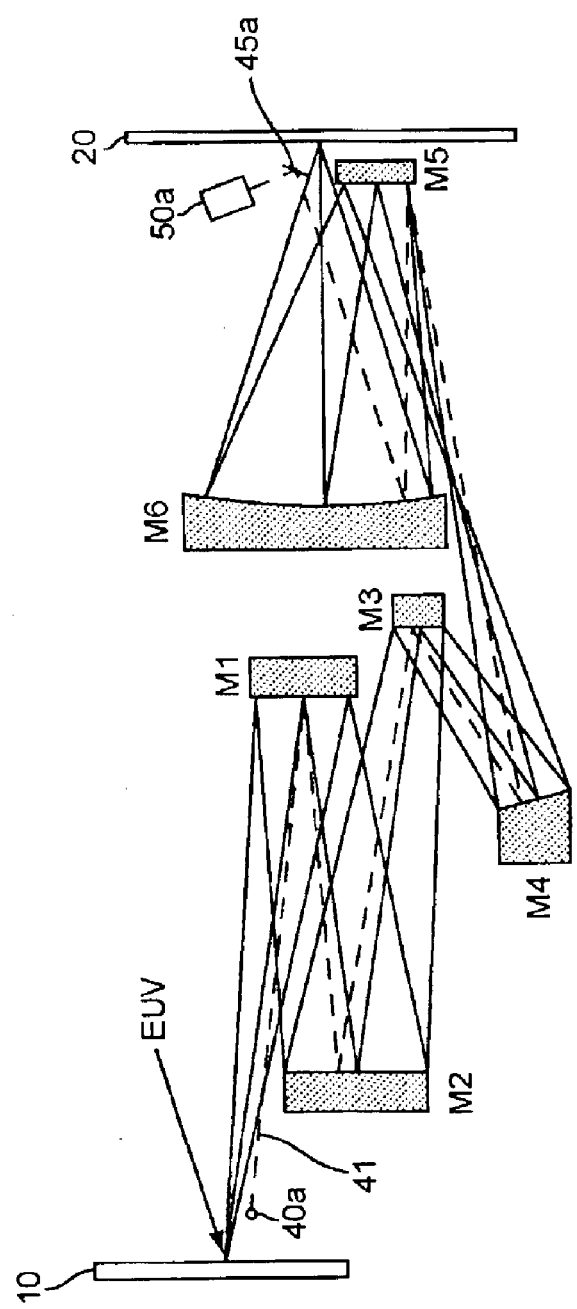
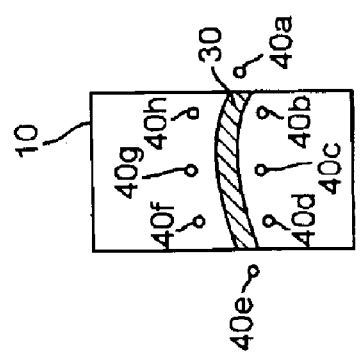
Figure 7A
Figure 7B

DEFORMABLE MIRROR ACTUATION SYSTEM

CROSS-REFERENCE TO RELATED APPLICATIONS

This application claims priority of U.S. Provisional Patent Application Ser. No. 60/390,158, filed Jun. 21, 2002, entitled "Deformable Mirror Actuation System" which is hereby fully incorporated by reference.

BACKGROUND OF THE INVENTION

1. Field of the Invention

The present invention generally relates to high precision imaging using a reflective optical element and, more particularly, to high precision lithography exposure systems and methods using one or more adaptive, reflective optical elements to minimize aberrations and measurement and control therefor.

2. Description of the Prior Art

Many manufacturing and scientific processes require the use of optical systems having extremely high accuracy and freedom from aberrations as well as the ability to make observations and/or exposures in wavelength regimes well outside the visible spectrum. For example, at least one lithographic exposure process is invariably required for establishing the location and basic dimensions of respective electrical or electronic elements in semiconductor integrated circuits in which the number of such elements on a single chip can extend into the tens if not hundreds of millions. The respective electrical or electronic elements can be very small, and placement in close proximity, sometimes referred to as high integration density, is highly desirable in order to reduce signal propagation time and susceptibility to noise as well as to achieve other advantages such as increased functionality and, in some cases, manufacturing economy. These circumstances provide strong incentives to develop smaller minimum feature size regimes which must be established through lithographic exposures of a resist. Therefore, feature resolution and fidelity of the exposure image must be held within a very closely defined budget which is a small fraction of the minimum feature size.

The resolution of any optical system is a function of the wavelength of the radiation used for the exposure, although some arrangements such as phase-shift masks have helped to extend exposure resolution below the wavelength of the exposure radiation. Nevertheless, resolution of extremely small features requires correspondingly short wavelengths of radiation. Accordingly, use of X-rays for lithographic exposure by exposing a mask in close proximity to the wafer is known but not widely used due to the requirement for fabrication of an exposure mask at the same minimum feature size as the final desired pattern. Optical and electron beam projection systems can, however, achieve such image pattern size reduction in the exposure pattern relative to feature sizes in a reticle which establishes the pattern to be exposed. Between these two techniques, the manufacturing process for reticles for electron beam projection is much less developed than for optical reticles and, perhaps more importantly, require many more exposures to form a complete integrated circuit pattern since the exposure field at the chip is comparatively more limited in electron beam projection systems. Therefore, there is substantial continued interest in optical lithographic exposure systems and extending their capabilities to shorter wavelengths, such as extreme ultraviolet (EUV).

EUV wavelengths are generally considered to be in the range of about 12 to 14 nanometers and more specifically within a range of less than one nanometer in a band centered on 13 nanometers. At such wavelengths, most imaging materials which are transparent in the visible spectrum and which are suitable for lenses are substantially opaque to the imaging radiation. Therefore, optical systems have been developed and are known which have only reflective elements. To achieve the necessary resolution and uniformity of performance over the illuminated field, the optical aberrations associated with the properties of the reflective elements must be strictly controlled. The maintenance of high manufacturing yield in the above-discussed exemplary environment thus requires not only high stability of the optical system but frequent measurement and adjustment to assure an adequately high level of optical performance of the system.

While techniques of measurement of wave-front aberrations are well-known and sufficient to accurately characterize the performance of optical systems and elements thereof, practical arrangements for conducting such measurements are difficult and complex. For instance, measurements cannot be made on axis or within the exposure/projection field during an exposure without interference with that exposure (e.g. by casting shadows or otherwise occupying a portion of the focus plane of the system where the substrate is located). Measurements performed between exposures may not be regarded as measurements of optical performance during the exposure and do not directly characterize the lithographic image, itself, but are often the only practical solution at the current state of the art even though sources of error may be introduced. Optical performance generally degrades with increasing distance from the optical axis of the system and, as a practical matter, it is desirable to use as much of the field where sufficient precision, resolution and freedom from aberrations can be maintained for projection of the desired image.

Active optics, sometimes referred to as adaptive optics, are known but have not been widely used to date in lithographic applications. Active optics involve the ability to change the overall or local shape of optical elements to alter the optical properties of the element. The article "Active Optics: A New Technology for the Control of Light" by John W. Hardy, Proc. of the IEEE, Vol 66, No. 6, June, 1978, provides an overview of this technology and is hereby fully incorporated by reference. In particular, some general suggestions for provision of mechanical arrangements for achieving localized or generalized deformations of reflecting optical elements to achieve different optical effects such as compensating for atmospheric turbulence are provided. However, mechanical actuators which deflect portions of the optical element such as are disclosed therein may present numerous problems of stability, hysteresis and the like and may be unsuitable for optical element deformations which may be only a relatively small fraction of a very short wavelength. In addition, if measurements of the optical system properties can only be performed at intervals between exposures, the stability of the optical element adjustment becomes critical.

SUMMARY OF THE INVENTION

The present invention provides an optical system operable at EUV wavelengths employing stable mechanical control of one or more adaptive optical elements for optimization of optical performance and minimization of aberrations. The invention also provides an apparatus and method for optical element deformation by mechanical actuation that controls the local deformation of areas of an optical element to provide desired or aberration-compensating performance of the optical system.

In accordance with another aspect of the invention, the invention provides a method of adjusting the shape of a surface of a body of material including steps of applying forces developed by one or more actuators to the body of material at spatially separated locations through mechanical linkages, and restraining motion of a mechanical linkage using a clamp to stabilize shape of the surface of the body of material in accordance with forces developed by a corresponding actuator.

BRIEF DESCRIPTION OF THE DRAWINGS

The foregoing will be better understood from the following detailed description of a preferred embodiment of the invention with reference to the drawings, in which:

FIG. 7A is a schematic diagram of a preferred embodiment of the overall system of the invention as applied to a catroptic lens system, FIG. 7B is a schematic diagram illustrating the location of light sources used to monitor the optical system stability.

DETAILED DESCRIPTION OF A PREFERRED EMBODIMENT OF THE INVENTION

Figure 1A:
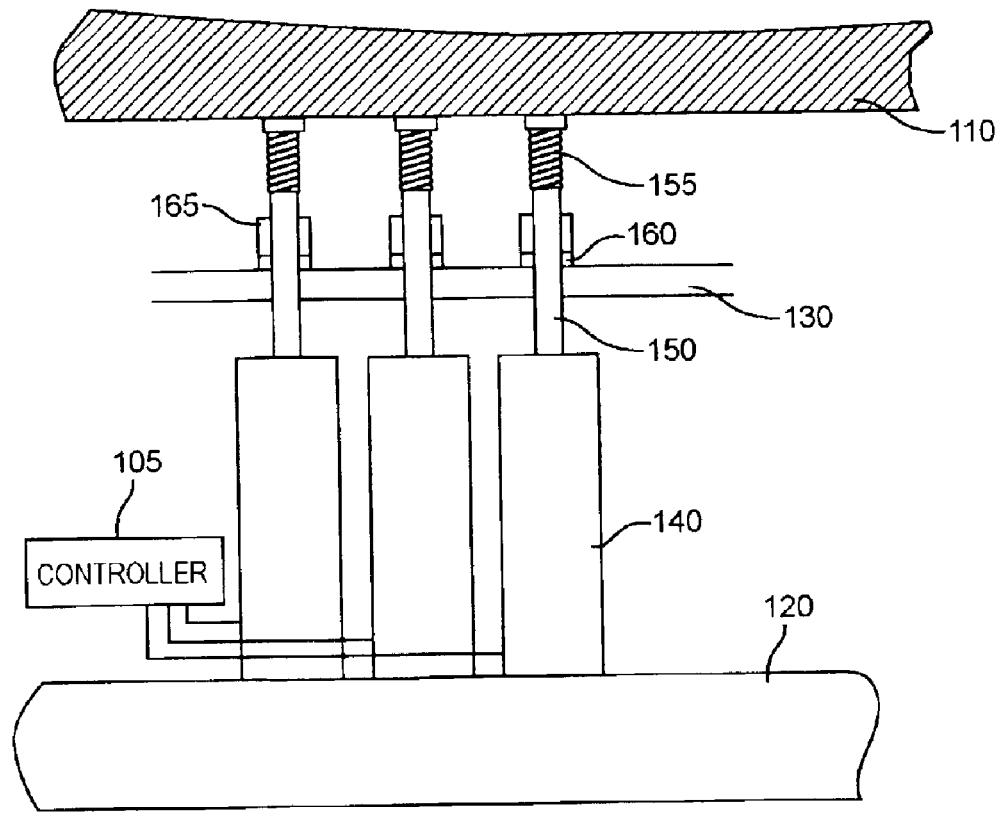
FIGS. 1A and 1B illustrate a preferred form of mechanical linear actuators for applying forces to respective areas of a reflective optical element.

Referring now to the drawings, and more particularly to FIG. 7A, there is shown an exemplary catroptic optical system with which the invention may be employed as well as in any reflective element of any optical system. All optical elements of this system are reflective and thus the optical system is suitable for projection of EUV wavelengths. The illustrated optical system is suitable for image projection of a pattern established by the reticle onto a target such as a resist-coated wafer. It should be further noted that this optical system is relatively complex; including six mirrors and having a folded optical path among the elements and principally off-axis which, itself, may give rise to significant aberrations.

Deformable mirrors are used in adaptive optics to alter the properties of a system in real time. The deformable mirror forms part of the optical system. The wave front of light transmitted through the optical system is measured and the shape of the mirror is adjusted to correct the wave front appropriately (e.g. to minimize aberrations in other parts of the system or to compensate environmental changes outside the optical system as is common in astronomical optical observations). Typically the corrections vary with time and adequate frequency response is often an important design parameter.

It should be understood that application of adaptive optics to high resolution lithography is a relatively recent development and differs from many past, so-called real-time adaptive optics systems, by operation in a static or quasi-static mode, since the adaptive optics are used to compensate for manufacturing aberrations in the remainder of the system and/or for thermally induced changes in properties of the optical system rather than compensating for environmental conditions such as gravitational distortions and air turbulence. Measurements of the wave front properties and adjustments of the adaptive optics are thus generally infrequent and stability of the figure of the mirror is of much greater importance. This requirement for lithographic and some other applications presents problems of actuator drift, noise, vibration and heat which may degrade the performance of the optical system as well as the operation of the adaptive optics.

It should be understood that the invention, in accordance with its basic principles, can be applied to any or all reflective elements of any optical system and could, for example, be applied to all optical elements of the optical system of FIG. 7A although, in practice, it is generally sufficient to provide adaptive or active optics on only a single element or a relatively few elements of an optical system. However, it is necessary to provide for measurements of any existing aberrations at least periodically (e.g. possibly as infrequently as once per week for measurement of total aberration) such that corrective action can be taken to adjust the adaptive optic to reduce aberrations to an allowable amount.

While required adjustments to the adaptive optics may be infrequent, it is necessary to monitor the state of the optics nearly constantly, in order to insure that the image quality has not degraded and affected the quality or yield of semiconductor devices being processed by the lithography tool. In other words, if the optical quality should change abruptly so that all semiconductor devices subsequently processed by that tool are of degraded quality or even must be rejected, the economic costs to the tool owner can be severe, unless the tool is immediately shut down and repairs or adjustments made. Therefore it is useful to distinguish between measurement of the system optical aberrations and monitoring the stability of the system optical quality. The first task requires fairly extensive measurements of the wave front of the imaging illumination over the entire field of the image. After extracting the aberrations, decisions can be made about adjusting the adaptive optics in order to compensate the aberrations. The second task requires monitoring the image quality with sufficient sensitivity to inspire confidence that the optical properties have not changed. If a change in system performance is detected, the information gathered may not be sufficient to identify fully the nature of the change, only that a change has occurred. Then extensive measurements of the image wave front must be performed.

Since the aberrations must be mapped over the image field, the metrology system must be on-axis and must replace or displace the reticle temporarily. Thus aberration determination represents a complete interruption in normal tool operation, so the adaptive optics system must be stable enough that this process is needed only occasionally.

Monitoring the stability of the optical system can probably be done with less extensive measurements, and it should be possible to accomplish this from measurements done off-axis, so normal operation of the tool can continue during the monitoring.

The monitoring system in accordance with the invention is installed as part of the projection optics. A light source 40a, possibly with a wavelength different from the exposure wavelength (as is possible since no optical elements are refractive) is situated beyond the illuminated region of the reticle. The light source 40*a* is shown located below (on the wafer side of) the reticle. FIG. 7B shows the reticle from this side. The reticle is illuminated by EUV radiation which illuminates a generally arcuate region 30 of the reticle and is fixed relative to the optics. The reticle moves back and forth through the illuminated region 30 while the wafer is moved synchronously, so that the complete reticle pattern is exposed on a chip site on the wafer. The location of the source 40*a* is advantageous, because there is no interference between the source 40*a* and the moving reticle. A single ray 41 is representative of the path of illumination from the source 40*a* through the optical system. Because the source 40*a* is closer to the wafer than the reticle, the source's conjugate plane lies below the top surface of the wafer. A turning mirror 45*a* deflects the image of the source 40*a* to a detector 50*a* which measures its aberrated wave front.

The wave front information from a single point in the object plane is not sufficient to determine the optical system aberrations. However, changes in the optical system aberrations will cause changes to the detector 50*a* signal, and alert the tool operator that exposure of product should stop until a full on-axis aberration measurement and system re-calibration is conducted.

The sensitivity of changes in the detector 50*a* signal to optical system changes is not known and must be determined. Moreover, since source 40*a* lies beyond the illuminated region 30 of the reticle, some vignetting of the illumination by the optical system mirrors may occur. This means that some mirrors may not be completely illuminated by source 40*a*, so changes to the shadowed regions of these mirrors will have no effect on the detector 50*a* signal, and thus some changes to the optical system, which may affect lithographic performance, may go undetected. To avoid this, and provide additional information about the optical system conditions, additional light sources may be provided around the periphery of the illuminated region 30. Some additional sources 40*b*–40*h* are shown in FIG. 7B. These sources each require a turning mirror (not shown) and detector (not shown), although it may be possible to reposition a single detector and turning mirror in order to sequentially measure the aberrated image from a number of sources. By combining the information from these additional detectors, sufficient illumination coverage of the optical system's mirrors should be achieved to ensure that changes to the optical system will be detected.

Figure 7C:
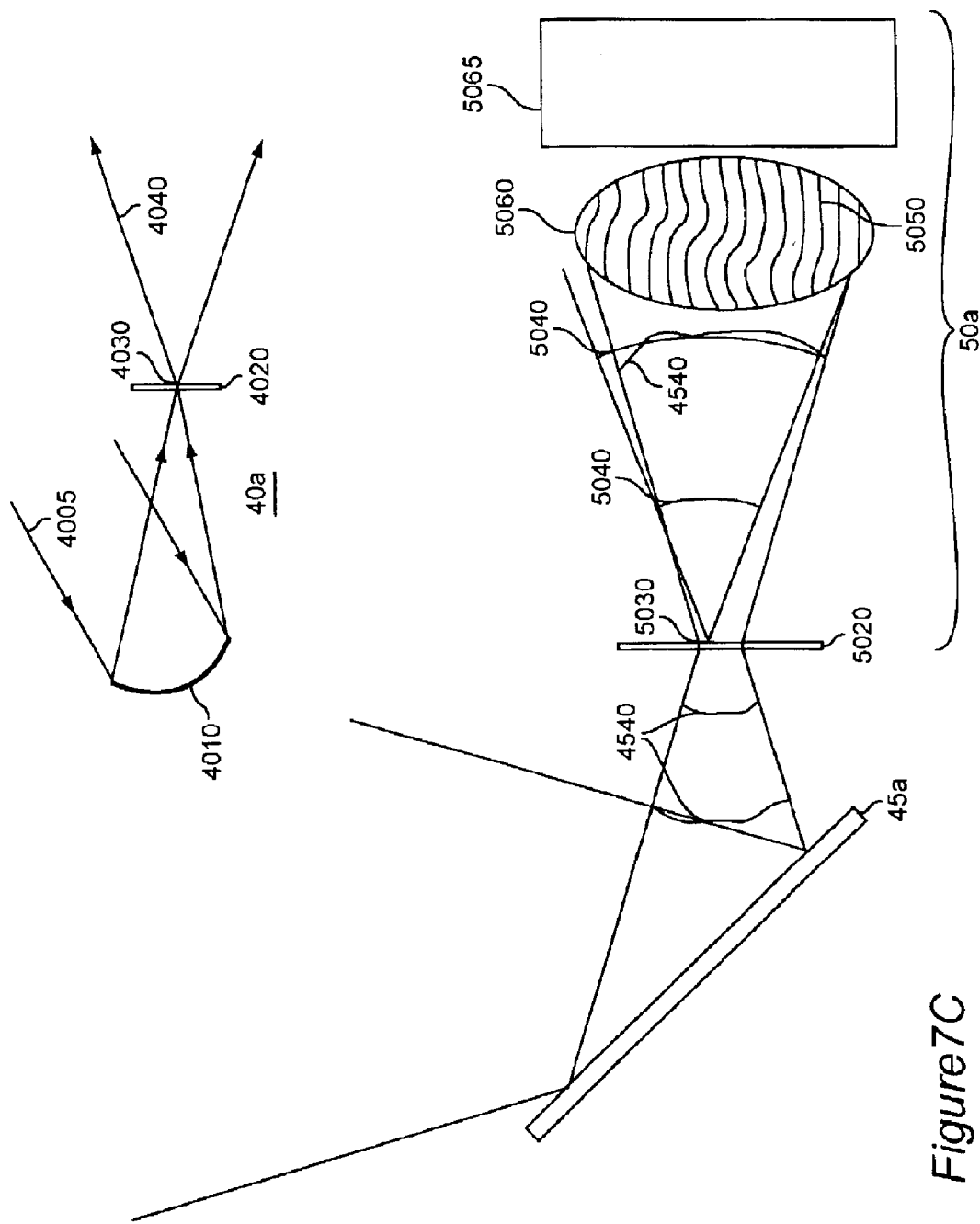
FIG. 7C is a schematic diagram of an embodiment of an optical system aberration monitor.

Some embodiments of the optical aberrations monitoring system are given. FIG. 7C shows enlargements of the areas around the light source 40*a* and the turning mirror 45*a* and detector 50*a*. In the first embodiment the light source wavelength is the exposure wavelength, and the monitor is a type of point diffraction interferometer. EUV radiation 4005 is incident on a mirror 4010 which focuses it onto a thin plate 4020, located near the focal plane of the mirror 4010, containing a pinhole 4030 whose dimension is near the diffraction limit of the radiation, so a perfect spherical wave 4040 is generated from the pinhole over a limited solid angle. This represents a spatially coherent source of radiation. The condenser optics of the EUV source are modified such that some radiation from the EUV source reaches the mirror 4010. After passing through the projection optics, the wave front 4540 of the radiation is no longer spherical because of the optical system aberrations, and it does not focus to a point but rather to a distribution resembling an Airy pattern to a high degree of accuracy over a finite extent. The radiation is reflected by the turning mirror 45*a* and focused in a plane containing a semitransparent membrane 5020 containing a pinhole 5030 whose dimension is near the diffraction limit of the radiation, so a perfect spherical wave 5040 is generated from the pinhole over a limited solid angle. The spherical wave 5040 serves as a "reference" wave front. The spherical wave 5040 and the aberrated wave 4540 interfere with one another to produce an interferogram 5050 on a screen 5060 which represents the front surface of an imaging radiation sensor 5065 such as a CCD camera. The pattern of the interference fringes can be related to the aberrations of the optical system. The CCD signal is monitored by a computer (not shown). If changes to the interferogram 5050 pattern occur and exceed some predetermined threshold, the computer signals that optical system aberrations have changed beyond an acceptable level.

The part of the wave front 4540 which creates the perfect spherical wave 5040 at the pinhole 5030 is off-axis and of relatively small intensity. The degree of semi-transparency of the membrane 5020 is chosen so that the intensities of the reference wave 5040 and the aberrated wave 4540 are roughly comparable where they interfere at the screen 5060, so as to maximize fringe contrast in the interferogram 5050. Information about the practical details of the point diffraction interferometer, including the pinholes and membrane for applications at EUV wavelengths may be found e.g. in K. Goldberg et al, Journal of Vacuum Science and Technology B13, 2923(1995).

Alternatively, instead of using exposure wavelength radiation, one can substitute a coherent light source such as a laser. The pinhole 4020 may not be needed in this case. The laser wavelength may be longer than the exposure wavelength, but the interferogram may still be sensitive enough to detect any significant changes in system properties. Recent comparisons of EUV and visible light interferometry of the same optical system have shown agreement to a fraction of a nanometer.

Since the purpose of the monitoring system is to detect changes in the optical system aberrations, rather than identify the individual aberrations, the information available from the point diffraction interferometer, or perhaps several point diffraction interferometers associated with additional radiation sources 40*b*, 40*c*, 40*d*, . . . , may be sufficient to monitor the stability of the optical system. Should additional information about the aberrations be required, more sophisticated interferometers may be employed. For example a phase shifting point diffraction interferometer, as described in e.g. H. Medecki, Optics Letters 21, 1526(1996), or U.S. Pat. No. 5,835,217, could be employed using a radiation source at either the exposure wavelength or a longer wavelength. Alternatively, a phase shifting diffraction interferometer, such as described in U.S. Pat. No. 5,548,403, could be employed at longer wavelengths where optical fibers are transparent. Another alternative is to use a wave front shearing interferometer, such as described in A. Ray-Chaudhuri et al, Journal of Vacuum Science and Technology B14, 3964(1996)). Such an interferometer can be used at the exposure wavelength or at longer wavelengths.

Two basic types of actuators are employed. Displacement actuators control the shape of the mirror by adjusting their length between the mirror and a fixed base plate. However, any distortion of the base plate will change the mirror figure unless the displacement of the actuator by the distortion of the base plate is corrected. In contrast, a force actuator applies a specified force to the mirror to achieve the desired deformation. Thus, as long as the force is constant, the mirror figure is fixed, even if the base plate should deform. Unfortunately, displacement actuators may be difficult to adjust to obtain very small length changes and are not generally well-suited to the types of adjustment required for lithographic applications, particularly in terms of stability. However, by inserting a relatively weak spring between the fixed end of an actuator (e.g. a displacement actuator) and the back of the mirror, small changes in the actuator displacement have little effect on the mirror figure, since their small displacements hardly affect the spring force. In other words, mirror deformation may be accomplished with force actuators or displacement actuators with much improved stability and control characteristics by the addition of a weak spring in the mechanical linkage such that they function in the manner of a stable and easily controllable force actuator.

The meaning of a "weak" spring is explained here. Since the displacements sought for the mirror are very small, linear behavior can be assumed. Then, in order to displace the mirror locally by an amount $\delta z_m$, a force $\delta F$ is required. The two are related by the force constant $K_m$ of the mirror which depends on the elastic properties of the mirror and is defined by the relation $\delta z_m = (dz/dF)_m \delta F = K_m \delta F$. The force $\delta F$ is produced by a compression of the spring with the displacement or force actuator. Assuming the spring to be elastic, the amount of compression required is given by $\delta F = k_s \Delta z_s$, where $k_s$ is the spring constant. Substituting for $\delta F$ gives the relation $\delta z_m = (dz/dF)_m \delta F = K_m \delta F = K_m k_s \Delta z_s$. The quantity $\delta z_m$ is typically of the order of a nanometer or less, and it is not easy to control displacements that small. But by adjusting the spring constant $k_s$ so that $\Delta z_s$ is much larger than a nanometer, control of the mirror displacement is simplified, and many different actuator types may be used. This condition is ensured by making $k_s$ sufficiently small relative to $K_m$. This is the meaning of a weak spring.

Adjustment of the shape of an optical element with small set-screw-like mechanisms is suggested in the above-incorporated article by Hardy. It is suggested in FIG. 31 of that article to employ a spring associated with a nut which rides along a threaded, motor-driven screw. This type of arrangement is acceptable for a substantially permanent adjustment of the shape of the element to compensate for manufacturing variation and the like. However, other environmental factors such as temperature can also affect the shape of optical elements and, moreover, the manual adjustment to compensate for aberrations is complex and time-consuming. Thus, such an adjustment arrangement may not be well-suited to provide adaptive alteration of the shape of an optical element. Further, actuators for turning screw mechanisms are expensive, especially if fabricated at such small sizes as the potential spacing of screw mechanisms may dictate for sufficiently compensating for aberrations of an optical system with high spatial resolution.

Figure 6A:
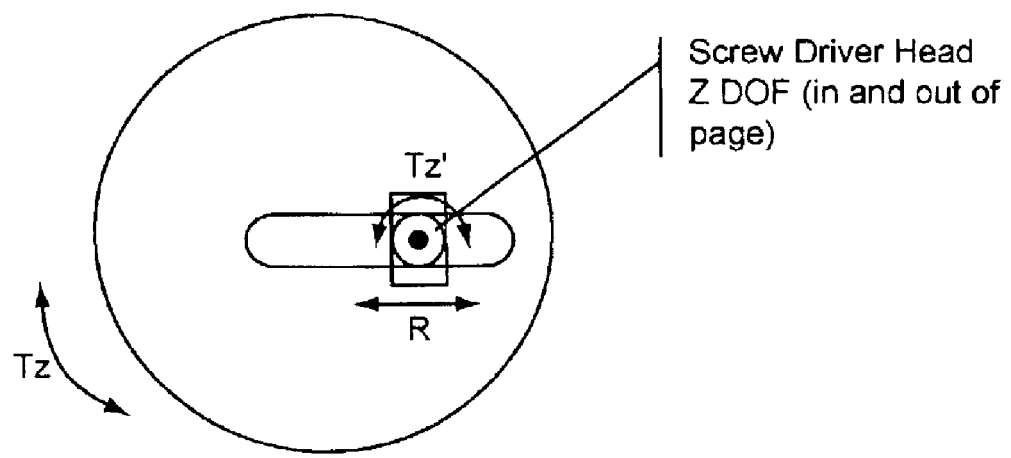
FIG. 6A is a plan view of an actuator for adjusting screw mechanisms for applying force to a reflecting optical element.

FIG. 6A is a plan view of an actuator in accordance with the invention which can be fabricated at relatively low expense and is capable of making rapid and automated adjustments of screw mechanisms for altering the shape of an optical element. Essentially, this mechanism is a robotic screw driver with four degrees of freedom. The body of the robotic screw driver is preferably in the form of a disk which can be rotated about its center as indicated by arrow Tz. A slot is formed in the disk for radial motion R of the screw driver which is moved in the direction Z (into or out of the page) to engage the screw mechanism and then rotated in the direction Tz' to make the adjustment of the screw mechanism. It will be recognized that the motions R and Tz are sufficient to locate the actuator/screw driver head at any location covered by the disk (e.g. as shown in FIG. 6B) and adjustments of any and all such screw mechanisms may be made rapidly in sequence, and a high density array of set-screw mechanisms may be accommodated.

Figure 6B:
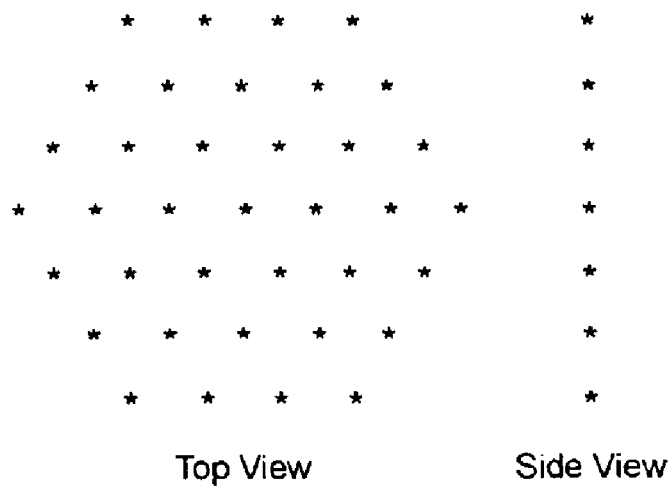
FIG. 6B is a plan view of an array of locations of set screws for adjustment of optical element shape.

More specifically, in FIG. 6B, the dots in the top and side views schematically depict exemplary locations of set screw type adjustment mechanisms (the details of which are unimportant to the practice of the invention). The array of such mechanisms shown essentially places the individual mechanisms at the apices of equilateral triangles tiling the area of the optical element. It should be understood that the extent of the array is arbitrary and the depiction of FIG. 6B may be understood as only a representative portion of the entire array. It can thus be seen that the rotational and radial motions of the robotic screwdriver of FIG. 6A is sufficient to align the screw driver head with any location depicted in FIG. 6B and coarse incremental motion and/or increase of size of the robotic screwdriver can accommodate an array of arbitrary extent.

Only four actuators are required for the four respective degrees of freedom of the mechanism while a very large number of set-screw mechanisms may be adjusted. Therefore, this arrangement is highly economical and allows relatively rapid adaptive alteration of the shape of the optical element. Multiple screw driver heads may be employed (e.g. along the R axis and/or about the Tz axis), if desired, with little added expense for more rapid adjustments Set-screws, whether or not including weak springs, are as stable as the thermal environment and require no holding force once set. However, the rotational position of set screws is subject to actuator drift and noise when connected to an actuator and are subject to instability due to vibration in any case.

Therefore, highly stable optical compensation is generally provided if the temperature of the environment is kept relatively stable, especially if weak springs are employed, as discussed above. Other temperature compensating arrangements can be employed as well. Further, in accordance with the invention, the same principles are not limited to set-screw type mechanisms but can be employed to move a single actuator or a small number of actuators of any type to cover a relatively large number of adjustment points. A high degree of stability can be obtained in a manner consistent with high spatial resolution of correction by providing for effective maintenance of any adjustment made, supplemented by reduced effects of drift, noise, vibration and heat by avoiding a need for continuous operation of actuators and/or use of very few actuators only as needed.

Figure 1B:
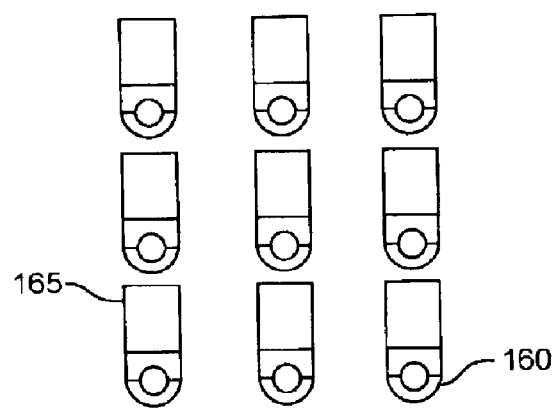

Referring now to FIGS. 1A and 1B, a preferred form of the invention is illustrated. In this embodiment, a shaft of a linear actuator or shaft connected thereto is attached to the back of a deformable mirror 110 through weak springs 155. Since the weak springs 155 are attached to both the deformable mirror 110 and the actuator shaft 150, a force can be applied in either of two opposite directions (e.g. pushing or pulling on the mirror 110). The actuators 140 are illustrated as supported rigidly on a base plate 120 but, as will be discussed below, other arrangements are possible and may be preferable.

The actuator shafts 150, preferably including weak springs 155, are individually guided in their motion by a plate 130 which is preferably rigid and of sufficient strength, comparable to that of actuator baseplate 120, to carry the forces of numerous actuator shafts and the forces they collectively impose on the mirror 110. However, it should be appreciated that rigidity of the base plate 120 and plate 130 is not critical to the practice of the invention if weak springs 155 are employed since the applied force determines the figure of the mirror and will not change significantly over small deflections of the base plate 120 or plate 130. Plate 130 is preferably configured as a clamp plate. That is, actuator shaft clamps may be affixed thereto or integrally formed therein (e.g. by machining openings in the clamp plate 130) as will be discussed below.

The deformable mirror system in accordance with the invention operates by using controller 105 to control actuators 140 to apply forces to the back of deformable mirror 110. The actuators may be of any type such as solenoids, fluidic systems, set screws, as alluded to above, and the like. The force is changed by compression or elongation of spring 155 through movement of the actuator shaft by the actuator until the desired deformation and force causing it is achieved. The deformations of interest to alter the figure of the mirror to correct or compensate other aberrations of the optical system are so small (e.g. on the order of the wavelength of the radiation employed which is very short in the EUV range) that the deformable mirror system may be considered as a linear system. That is, the deformation of the mirror is the linear sum of the deformations of each of the actuators applied individually through whatever mechanism or mechanical linkage is employed.

Once the desired figure of the mirror is reached through application of force by the actuators 140 through movement of the actuator shaft(s), clamping mechanisms are actuated using clamp actuators 165 to maintain the position of the actuator shaft(s) at that position. The clamps thus assume the load of the actuators and the actuators can be de-energized. (The clamps can also share the load of set-screw type arrangements while preventing rotational movement due to vibration or the like.) The clamps can also be arranged very close to the back of the mirror so that only a short portion of the actuator shaft and the spring remains between the clamp and the mirror in order to enhance stability, particularly as to temperature. That is, the positioning of the clamp close to the mirror reduces the length of actuator shaft which is subject to change of dimension due to change in temperature. The only limitation of proximity is the length of the weak spring 155 and the need to provide a sufficient range of shaft motion to derive the desired range of force corresponding to the desired range of mirror movement in consideration of the particular spring constant of the weak spring 155. As will be appreciated by those skilled in the art, change of spring constant and dimensions with temperature, the coefficient of thermal expansion of the actuator shaft and the anticipated range of thermal excursions may also be considered in the design for a particular application but are not critical to the successful practice of the invention.

In FIG. 1A the type of actuator is not specified. Strictly speaking a weak spring would not be needed for a pure force actuator, because whatever force is provided by the actuator is transmitted directly through the spring to the mirror through a mechanical linkage such as shaft 150. Other mechanical linkages such as levers (not shown) may be inserted between the force actuator and the spring which de-magnify the force from the actuator, thereby making the displacement of the mirror less sensitive to fluctuations or drift of the output of the force actuator. But even here the spring is not really necessary for the case of a force actuator. When the actuator shaft is clamped and the actuator turned off, however, both types of actuators become equivalent, and both require the weak spring to isolate the mirror displacement from changes in the clamp plate shape or position or changes in the shaft or spring properties caused by temperature change or possibly small amounts of slip by the clamps.

It should be appreciated that, by the use of the clamps such that the actuators can be de-energized, the actuators are effectively removed from the system as a source of heat or drift. Further, the clamps and their actuators can be configured in such a way that the clamp actuators are used only when an adjustment is made and no heat is generated from the clamp actuators 165 when the actuator shafts are clamped. Of course, de-energization of the actuators 140 and the clamp actuators after proper adjustment is reached also removes drift, noise and vibration as sources of instability in the deformable mirror system. Further, since the actuators 140 are de-energized after adjustment and the system is substantially linear, a reduced number of actuators may be used and the adjustments made serially while allowing actuator shafts 150 to be spaced more closely (e.g. at higher pitch) than the size of actuators 140 might otherwise allow.

Figure 2:
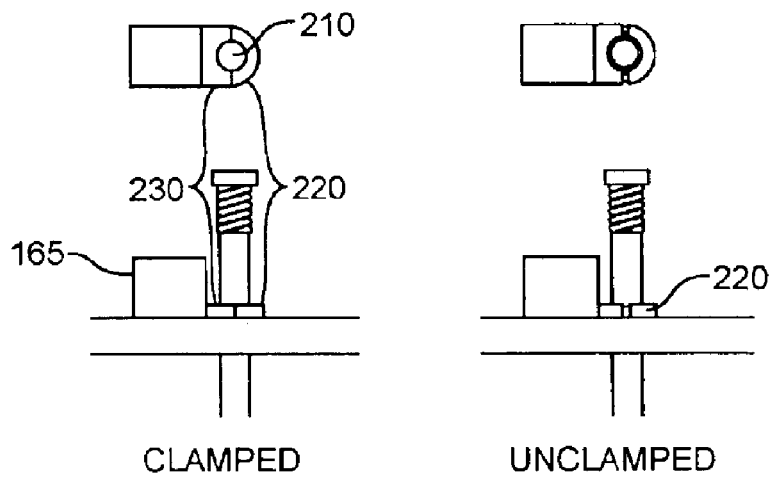
FIGS. 2, 3A, 3B, 4 and 5 illustrate alternative forms of the clamping mechanism of FIG. 1A.

More specifically and with reference to FIG. 2, plan and side views of clamps in clamped and unclamped positions are shown. The clamp is preferably formed with an aperture 210 for receiving the actuator shaft 150 and which is shaped to cause slight but sufficient binding with the actuator shaft 150 in the clamped position. This effect can be easily achieved by the preferred expedient of providing for opening of the clamp at diametrically opposite sides of the aperture 210 such that the movable clamp jaw 220 can be deformed slightly by a cam-like action as it presses against the actuator shaft 150, preferably under the influence of a force such as may be provided by a spring which will maintain the clamp in a clamped position when the clamp actuator 165 is de-energized. The binding action can also be enhanced by additionally causing binding against the surface of the guide hole in the clamp plate 130. Clamp jaw 230 can be either fixed or movable. It is considered preferable that both clamp jaws be moved away from the actuator shaft as positioned by the clamp plate 130 by the clamp actuator 165, when energized. Alternatively, if one of the clamps is fixed, it could be located at a slight distance from the actuator shaft, so that when the mobile clamp jaw is activated it pushes the shaft against the fixed jaw.

In FIG. 2 the clamp jaws are preferably shaped slightly differently from the shaft, so that when they close on the actuator, the applied force is over a restricted area of contact. This ensures a more secure clamping force and avoids the chance of the two components binding together and abrading their surfaces. For example, if the shaft of the actuator is of circular cross section, the clamp shape may be arc shaped, with a radius of curvature greater than the shaft radius.

Figure 3A:
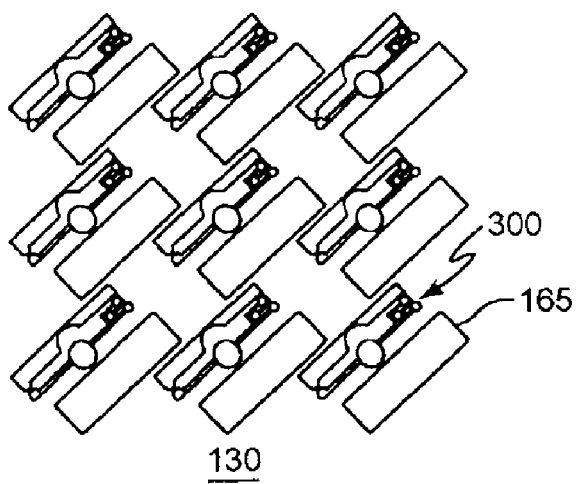
Figure 3B:
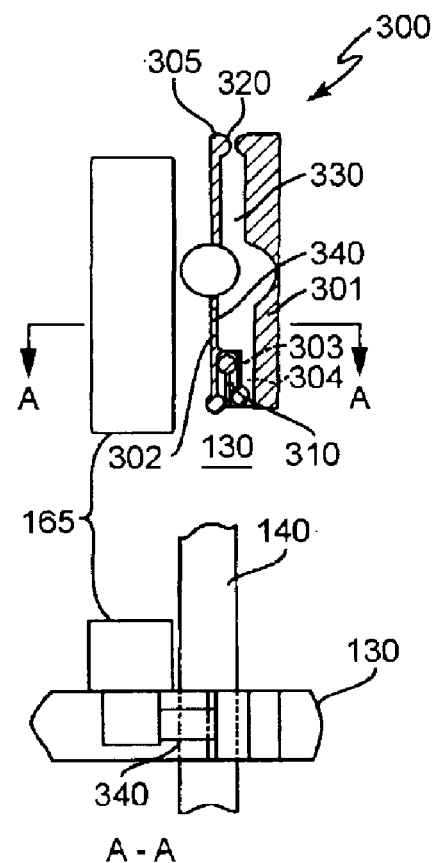

FIG. 2 is representative of an embodiment of the invention using discrete clamps and clamp actuators mounted on a clamp plate 130. However, as alluded to above, the clamp structure can be integrally formed in the clamp plate 130, as depicted in FIGS. 3A and 3B, as will now be discussed. FIG. 3A shows an array of clamps 300 and clamp actuators 165 where the clamps and the actuator springs 310 are integrally formed in the clamp plate 130. The use of the material of the clamp plate to form clamp springs is not inconsistent with the requirement for rigidity and stiffness of the clamp plate 130 since the clamp plate can be as thick as necessary to achieve sufficient stiffness and rigidity while minor deflection of the clamp plate is not critical if weak springs 155 are employed, as discussed above. (Increased thickness of the clamp plate 130 may also improve clamping action and assist in thermal regulation as well as providing additional mass that improves stability in the presence of a source of vibration.) Therefore, the material of the clamp plate 130 is not critical to the practice of the invention. The clamp plate with integral clamps and springs may be formed by any desired technique such as casting, molding or the like but machining is preferred for high precision and yield. The machining process is not critical, and milling, electric discharge machining, laser ablation and the like or a combination thereof can be used.

FIG. 3B shows a single clamp 300 and clamp actuator 165 in plan view and cross-section. The area 305 identified by cross-hatching is removed from the clamp plate. Area 305 comprises essentially two long slots 301, 302, with two additional short slots 303, 304, which are interdigitated to form a spring 310. Slots 301, 302 are separated but closely approach each other at one end in order to form a hinge 320. The material between the slots forms a clamp bar 330, generally corresponding to moveable clamp jaw 220 of FIG. 2. The configuration of the clamp bar should largely avoid the formation of a hinge structure adjacent the actuator shaft aperture by providing a relatively constant thickness of clamp bar 330, as shown, but some degree of flexibility at that point may enhance the binding action of the clamp. Other configurations of the cut-out are also possible but the pattern illustrated in FIG. 3B is considered to be preferred.

The actuator shaft 340 of clamp actuator 165 is preferably held in a recess formed in clamp plate 130 and an aperture to allow appropriate and convenient insertion into the recess and a mechanical coupling to the actuator is provided, preferably as shown. However, details of the shaft location and installation are not critical to the practice of the invention, as long as the clamp actuator shaft can bear against and move clamp bar 330 to increase separation from the remainder of the clamp plate and allow actuator shaft 140 to freely move in the axial direction. This motion will be opposed by deformation of the two cantilevers formed by short slots 303 and 304 forming a return spring 310 which will cause clamping to be resumed when clamp actuator 165 is de-energized or turned off. Thus, it is seen that the integrally formed clamp 300 functions in the same manner as the discrete clamp embodiment of FIG. 2 but has the added advantages of allowing a more simple actuator which may be of any type (e.g. electromagnetic, fluidic, mechanical and the like) and providing an integral return spring 310 that need not be included in actuator 165 while providing a more robust clamp.

Figure 4:
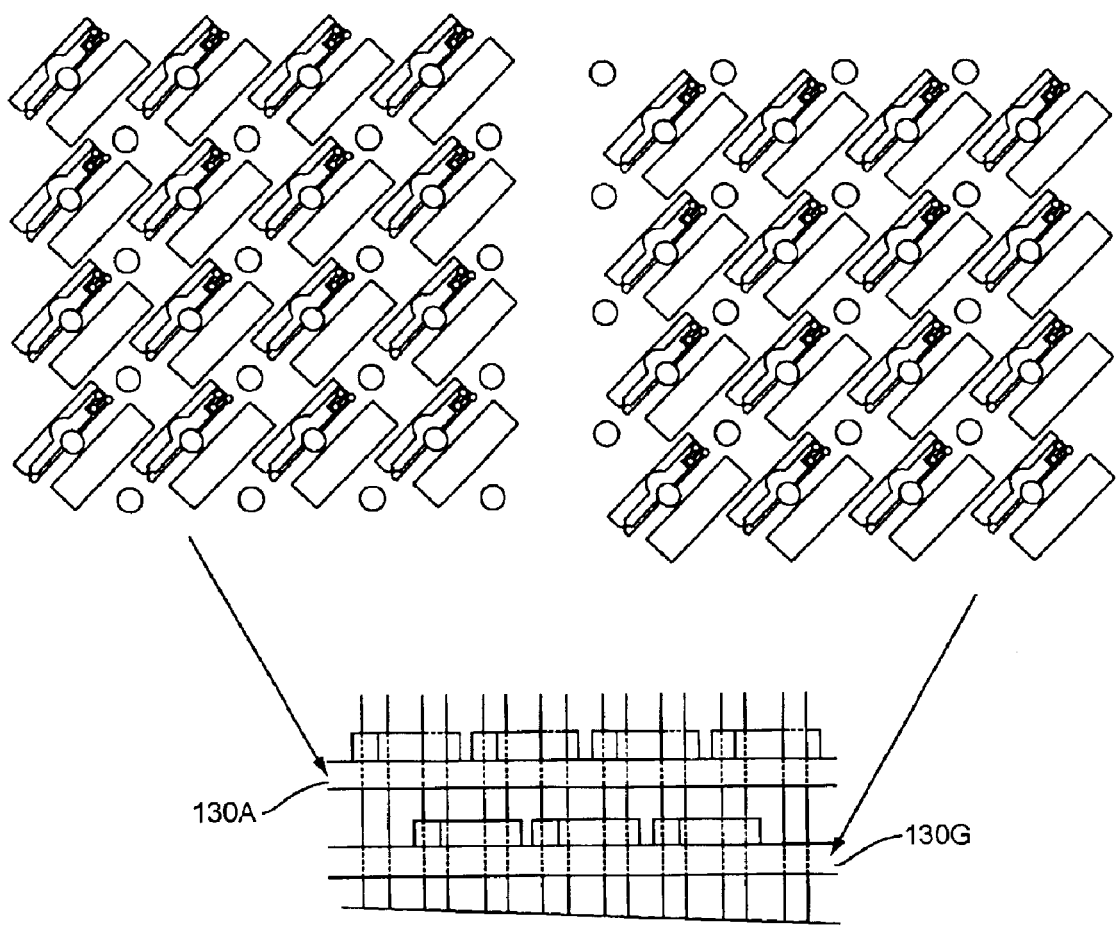

However, the integrally formed clamp of FIGS. 3A and 3B occupies somewhat more space on the clamp plate 130 than might be required by a discrete clamp. The size of the clamp actuators may further limit actuator shaft spacing pitch or density or even be controlling of the spatial frequency of control of the mirror shape which can be provided. However, accommodation of actuator shafts at higher spatial frequency can be provided by clamps in complementary and inter-digitated arrays on two or more levels using two or more clamp plates 130*a*, 130*b* as shown in FIG. 4. This configuration also provides for the loads supporting forces on the mirror to be divided and the thickness of each of the clamp plates can be correspondingly reduced. Clamp actuators may be placed on either or both surfaces of the of the clamp plate 130 or plates 130*a*, 130*b*.

Figure 5:
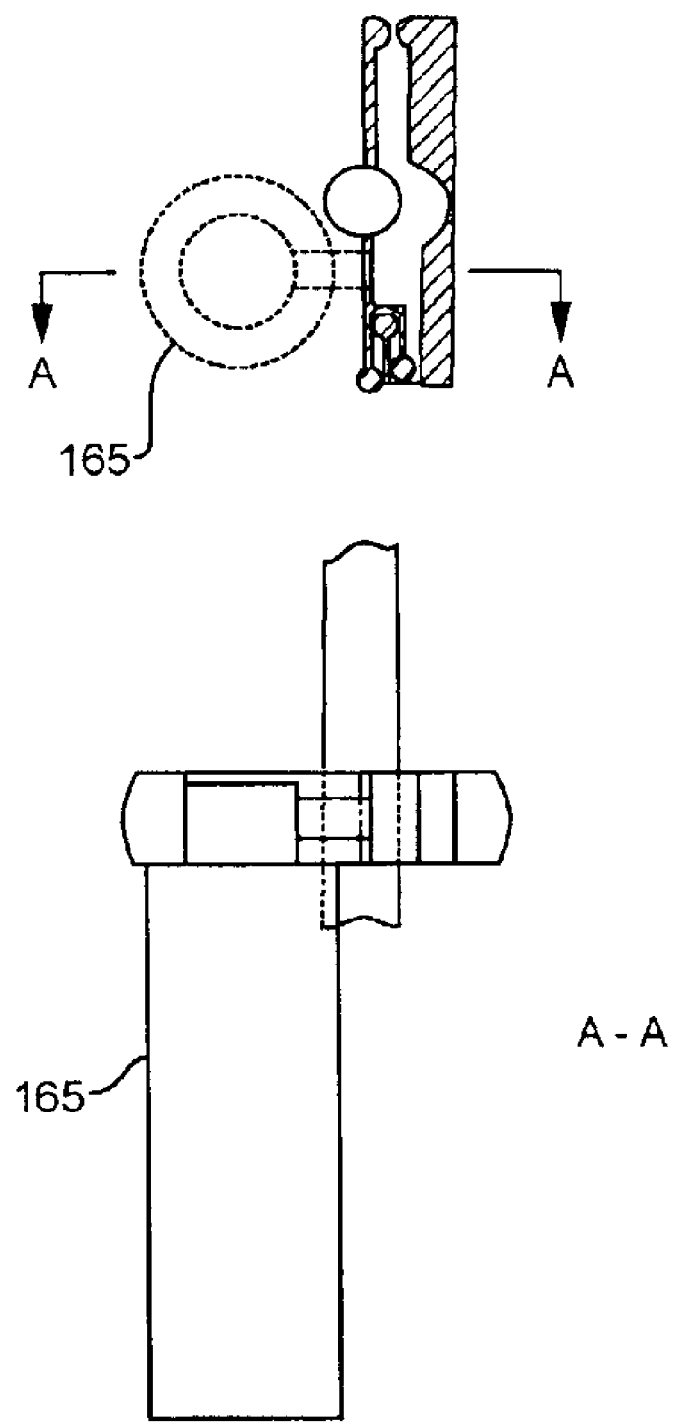
Figure 8:
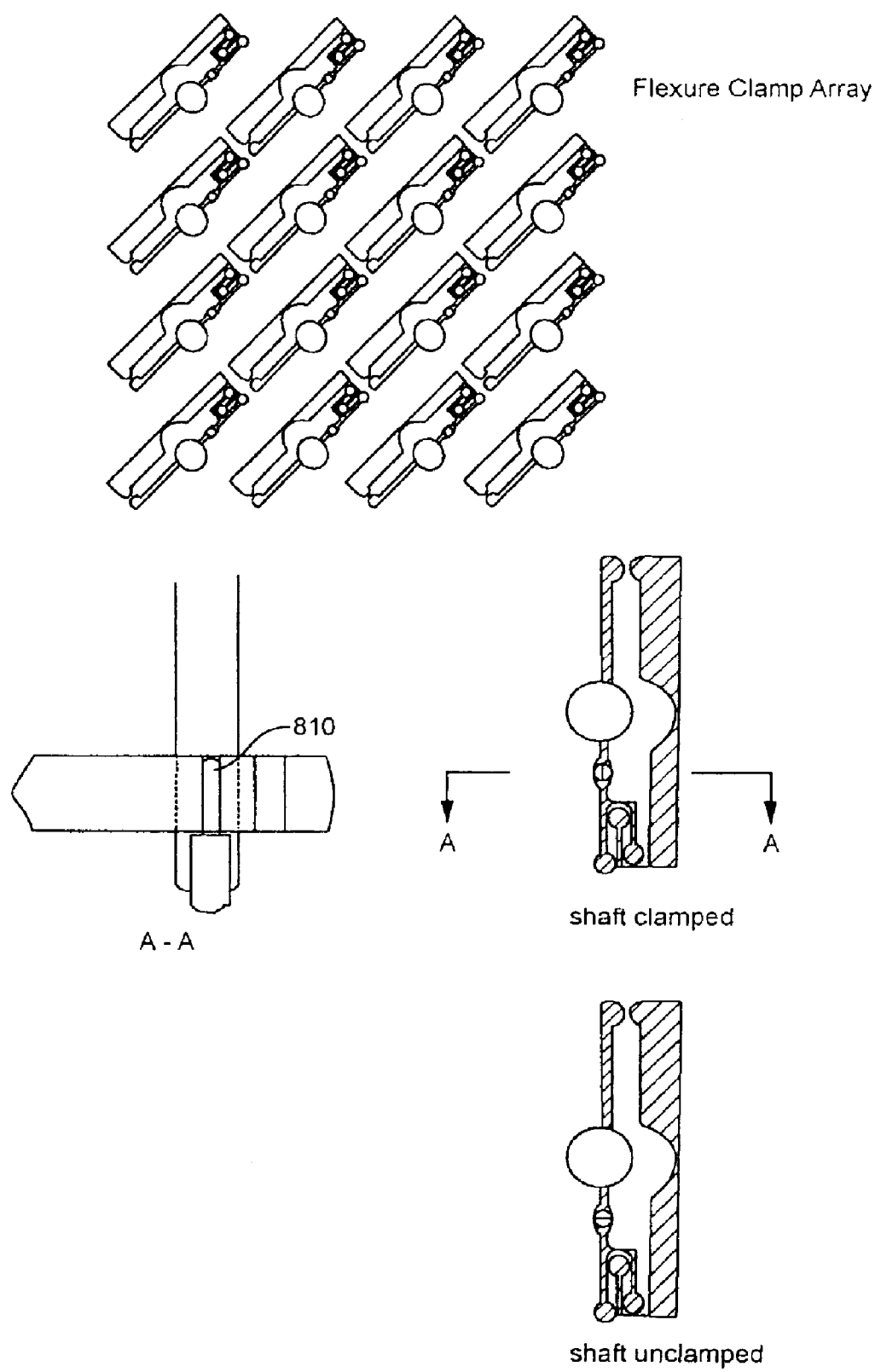
FIGS. 8 and 9 illustrate alternative embodiments of the invention.

Alternatively, actuator size may be accommodated consistent with high actuator shaft location pitch by orienting the actuators parallel to the actuator shafts 140 as shown in FIG. 5. Rotary actuators may also be accommodated in this fashion. Further, as shown in FIG. 8, a cam can be used in place of clamp actuator shaft 340. In this case, space can be saved by placement of the actuator over a portion of the clamp and, further, allows a single clamp actuator to be moved across the clamp plate 130 to operate clamps serially by inserting a cam of, for example, elliptical cross-section into slot 302. Moreover, in such a case, the clamp actuator 165 that drives cam 810 could be mounted on the same carriage as an actuator 140 since the clamp plate 130 and actuator base plate 120 are in different planes and suitably moved among the array of actuator shafts 140 to carry out a sequence of adjustments.

Figure 9:
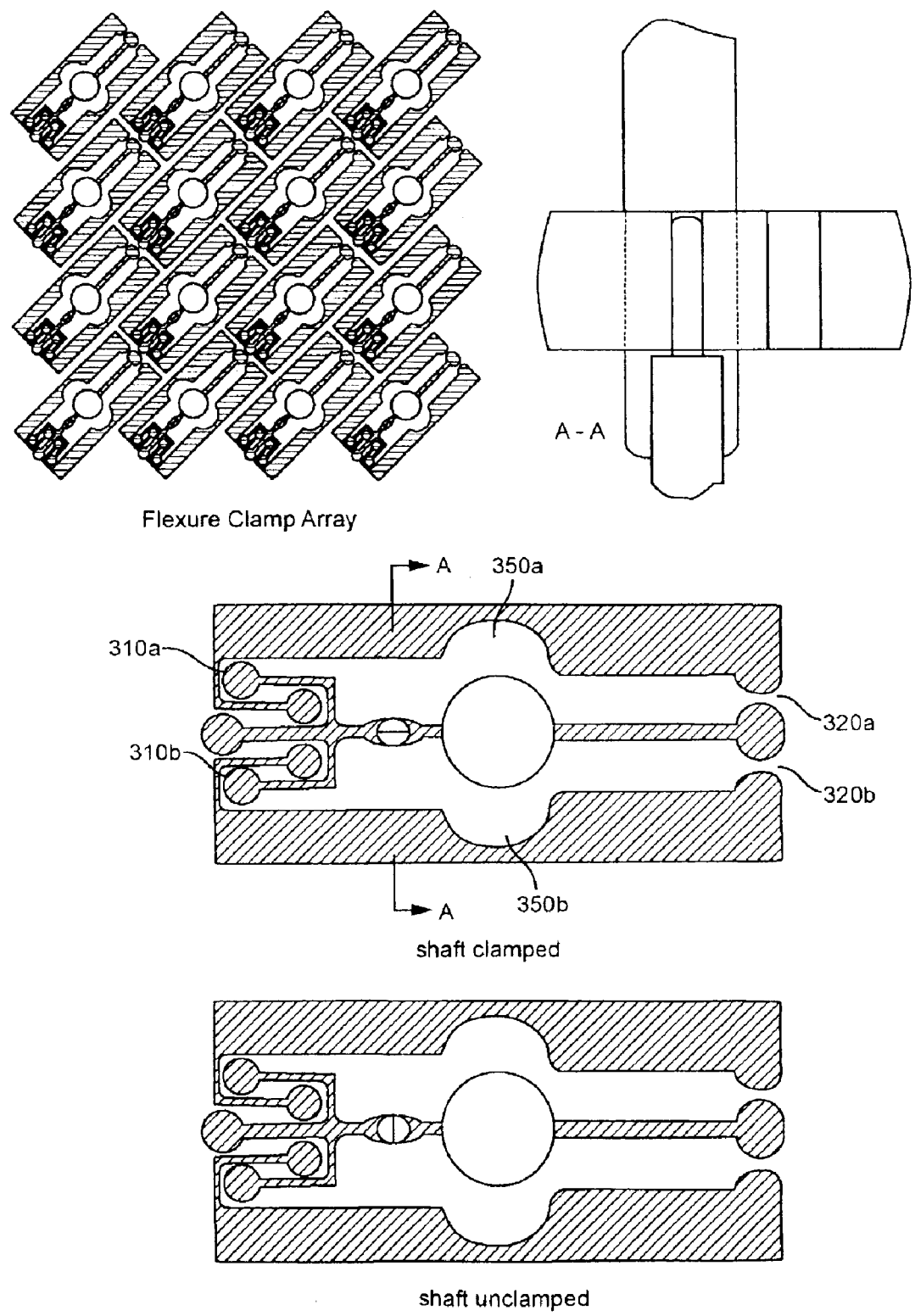

A further variation of the preferred embodiment of the invention is illustrated in FIG. 9. As alluded to above in regard to the embodiment having discrete clamps, clamp jaw 220 was movable and clamp jaw 230 was optionally but preferably moveable. It should also be appreciated that in the integrally formed embodiment of the clamp discussed above in connection with FIGS. 3A–5 and 8 that only the clamp bar 330, generally corresponding to clamp jaw 220 is moveable while the jaw corresponding to jaw 230 is formed in the base plate is stationary and would involve asymmetrical or eccentric operation of a cam in order to avoid directional (e.g. non-rotational) forces parallel to the clamp plate being placed on an actuator. The asymmetrical clamp action may also cause undesirable lateral shifting motion of the actuator shaft 140 that may be coupled to the mirror.

The embodiment of FIG. 9, however, while somewhat more complex than the embodiment of FIGS. 3A–5 and 8, provides symmetrical jaw motion by replicating the pattern of the clamp bar so that clamp bars 330*a*, 330*b* are provided on both sides of the actuator shaft cam and can be moved symmetrically by a cam which is axially rotated without developing directional forces on the actuator. The forces and pattern of contact between the clamp and the actuator shaft 140 are also symmetrical, and shifting of the actuator shaft 140 other than the desired axial position adjustment is avoided.

In view of the foregoing, it is seen that a deformable mirror system is provided in which stability of adjustments and corrections made is improved while effects such as actuator drift, noise, vibration and heating are substantially avoided. The invention also allows a single actuator or a reduced number of actuators to be shared among a plurality of actuator shafts and/or clamps, respectively, and supports provision of actuator shafts at increased density or pitch. A single actuator can be shared among a plurality of clamps, as well. Discrete or integrally formed clamps may be provided as may be desired to accommodate application of the invention at any scale and complexity and provides a practical technique for improving the performance of EUV lithographic tools in particular.

While the invention has been described in terms of a single preferred embodiment, those skilled in the art will recognize that the invention can be practiced with modification within the spirit and scope of the appended claims.

What is claimed is:

1. An adaptive optical system including
   a deformable optical element,
   an actuator for developing and applying a force to said deformable optical element through a mechanical linkage, and
   a clamp configured to maintain said force developed by said actuator by preventing motion of said mechanical linkage.

2. The adaptive optical system as recited in claim 1, wherein said mechanical linkage includes a weak spring having a spring constant which is small relative to a force constant of said deformable optical element.

3. The adaptive optical system as recited in claim 2, wherein said mechanical linkage includes an axially moveable shaft.

4. The adaptive optical system as recited in claim 3, wherein said clamp engages said shaft.

5. The adaptive optical system as recited in claim 4, wherein said clamp is formed by cut-outs in a plate.

6. The adaptive optical system as recited in claim 5, wherein said cut-outs are substantially in the form of parallel slots forming a clamp body therebetween.

7. The adaptive optical system as recited in claim 6, wherein said parallel slots form a hinge at a first end of said parallel slots and a plurality of cantilevers forming a spring at a second end of said parallel slots.

8. The adaptive optical system as recited in claim 7, wherein said clamp body engages one side of said shaft.

9. The adaptive optical system as recited in claim 8, wherein said clamp body is moved using a rotatable cam.

10. The adaptive optical element as recited in claim 7, wherein said slots form an opposing pair of clamp bodies.

11. The adaptive optical system as recited in claim 10, wherein said clamp bodies are moved using a rotatable cam.

12. The adaptive optical system as recited in claim 1, wherein said mechanical linkage includes an axially moveable shaft.

13. The adaptive optical system as recited in claim 12, wherein clamp engages said shaft.

14. The adaptive optical system as recited in claim 13, wherein said clamp is formed by cut-outs in a plate.

15. The adaptive optical system as recited in claim 14, wherein said cut-outs are substantially in the form of parallel slots forming a clamp body therebetween.

16. The adaptive optical system as recited in claim 15, wherein said parallel slots form a hinge at a first end of said parallel slots and a plurality of cantilevers forming a spring at a second end of said parallel slots.

17. The adaptive optical system as recited in claim 16, wherein said clamp body engages one side of said shaft.

18. The adaptive optical system as recited in claim 17, wherein said clamp body is moved using a rotatable cam.

19. The adaptive optical element as recited in claim 16, wherein said slots form an opposing pair of clamp bodies.

20. The adaptive optical system as recited in claim 19, wherein said clamp bodies are moved using a rotatable cam.

21. The adaptive optical system as recited in claim 1, further comprising an off-axis detector for detecting changes in aberrations of said adaptive optical system.

22. The adaptive optical system as recited in claim 1, further including a detector for monitoring changes in image quality of said adaptive optical system.

23. The adaptive optical system as recited in claim 22, wherein said detector includes one of a point diffraction interferometer, a phase shifting diffraction interferometer and a wave front shearing interferometer.

24. A method of adjusting the shape of a surface of a body of material, said method including steps of applying forces developed by an actuator to said body of material at spatially separated locations through a mechanical linkages, and restraining motion of a said mechanical linkage using a clamp to stabilize shape of said surface of said body of material in accordance with said forces developed by said actuator.

25. The method as recited in claim 24, wherein said body of material forms a part of an adaptive optical system, wherein said method includes the further step of monitoring changes of image quality in said adaptive optical system.

26. The method as recited in claim 25, wherein said step of monitoring changes of aberration is performed using one of a point diffraction interferometer, a phase shifting diffraction interferometer and a wave front shearing interferometer.

* * * * *